US009995991B2

(12) United States Patent
Ida et al.

(10) Patent No.: US 9,995,991 B2
(45) Date of Patent: Jun. 12, 2018

(54) IMAGE PICKUP APPARATUS

(71) Applicant: PANASONIC INTELLECTUAL PROPERTY MANAGEMENT CO., LTD., Osaka (JP)

(72) Inventors: Tetsuya Ida, Kanagawa (JP); Tatsuhiko Inagaki, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days. days.

(21) Appl. No.: 15/523,685

(22) PCT Filed: Nov. 26, 2015

(86) PCT No.: PCT/JP2015/005883
§ 371 (c)(1),
(2) Date: May 2, 2017

(87) PCT Pub. No.: WO2016/084380
PCT Pub. Date: Jun. 2, 2016

(65) Prior Publication Data
US 2017/0315426 A1  Nov. 2, 2017

(30) Foreign Application Priority Data

Nov. 26, 2014  (JP) .................. 2014-238634

(51) Int. Cl.
*G03B 17/08* (2006.01)
*H04N 5/369* (2011.01)
(Continued)

(52) U.S. Cl.
CPC ............. *G03B 17/08* (2013.01); *G03B 17/12* (2013.01); *H04N 5/2253* (2013.01);
(Continued)

(58) Field of Classification Search
CPC ........ G03B 17/08; G03B 17/12; G02B 13/14; G02B 7/04; G02B 7/021; G02B 7/028;
(Continued)

(56) References Cited

U.S. PATENT DOCUMENTS 8,456,769 B2 * 6/2013 Teraoka .................. G02B 7/021
359/819
8,886,031 B2 * 11/2014 Pope ...................... G03B 17/02
396/535
(Continued)

FOREIGN PATENT DOCUMENTS

DE  102004049871 A1  4/2006
JP  2001-292354 A  10/2001
(Continued)

OTHER PUBLICATIONS

International Search Report issued in Patent Application No. PCT/JP2015/005883 dated Feb. 16, 2016.
(Continued)

*Primary Examiner* — Pritham Prabhakher
(74) *Attorney, Agent, or Firm* — Pearne & Gordon LLP

(57) ABSTRACT

An image pickup apparatus includes a circuit board, a solid-state image sensing device disposed on an upper surface of the circuit board, a cylindrical lens barrel disposed above the circuit board, a lens housed in the lens barrel, and a holding member that holds the lens barrel and the circuit board therein. The solid-state image sensing device is positioned in an enclosed space formed by the lens barrel and the circuit board. The lens barrel has a first flange portion protruding in a direction perpendicular to a central axis of the lens barrel. The holding member has a first fitting groove portion in which the first flange portion of the lens barrel is
(Continued)

fit. A thermal expansion coefficient of the holding member is smaller than a thermal expansion coefficient of the lens barrel.

8 Claims, 4 Drawing Sheets

(51) Int. Cl.
  *H04N 5/225*   (2006.01)
  *G03B 17/12*   (2006.01)
  *G02B 7/02*   (2006.01)
  *H05K 1/18*   (2006.01)

(52) U.S. Cl.
  CPC ............ *H04N 5/369* (2013.01); *G02B 7/021* (2013.01); *H05K 1/181* (2013.01); *H05K 2201/10121* (2013.01); *H05K 2201/10151* (2013.01)

(58) Field of Classification Search
  CPC ...... G02B 7/025; H04N 5/369; H04N 5/2253; H04N 5/2254; H05K 1/181; H05K 2201/10121; H05K 2201/10151; H01S 5/005; H01S 5/02415; H01L 2254/48091
  USPC ......................................................... 348/294
  See application file for complete search history.

(56) References Cited

U.S. PATENT DOCUMENTS

| | | | | |
|---|---|---|---|---|
| 9,176,298 | B1* | 11/2015 | Gustafson | ............. G02B 7/028 |
| 9,778,435 | B2* | 10/2017 | Wakabayashi | ......... G02B 7/028 |
| 2002/0131782 | A1 | 9/2002 | Yamaguchi et al. | |
| 2008/0143864 | A1 | 6/2008 | Yamaguchi et al. | |
| 2008/0278833 | A1* | 11/2008 | Yuan | ...................... G02B 7/028 359/820 |
| 2011/0097072 | A1 | 4/2011 | Gottwald et al. | |
| 2011/0205644 | A1* | 8/2011 | Kojima | .................. G02B 7/028 359/820 |
| 2012/0019905 | A1* | 1/2012 | Teraoka | ................. G02B 7/021 359/356 |
| 2014/0340771 | A1* | 11/2014 | Wakabayashi | ......... G02B 7/028 359/820 |
| 2015/0092271 | A1* | 4/2015 | Matsusue | ............... G02B 7/028 359/511 |
| 2016/0097912 | A1 | 4/2016 | Kobori et al. | |

FOREIGN PATENT DOCUMENTS

| | | |
|---|---|---|
| JP | 2003-046825 A | 2/2003 |
| JP | 2008-304641 A | 12/2008 |
| JP | 2009-037055 A | 2/2009 |
| JP | 2014-006300 A | 1/2014 |
| WO | 2007/053404 A2 | 5/2007 |
| WO | 2014/167994 A1 | 10/2014 |

OTHER PUBLICATIONS

Written Opinion issued in Patent Application No. PCT/JP2015/005883 dated Feb. 16, 2016.
The Extended European search report issued in European Patent Application No. 15863154 dated Oct. 25, 2017.
Tarapath, "Macromelt Comparative Hardness Shore a Scale", Nov. 15, 2004, XP055416008.
Al-Dabbagh et at, "Thermal Expansion in Ferromagnetic Fe—Ni Invar Alloy", International Journal of Engineering and Science, Aug. 2012, pp. 2278-4721, vol. 1, Issue 1.

* cited by examiner

IMAGE PICKUP APPARATUS

TECHNICAL FIELD

The present invention relates to an image pickup apparatus using a solid-state image sensing device such as a CCD (Charge Coupled Device) image sensor or a CMOS (Complementary Metal Oxide Semiconductor) image sensor.

BACKGROUND ART

Recently, in accordance with increased performance of an image pickup apparatus using a solid-state image sensing device as one described above, electronic equipment equipped with an image pickup apparatus including an autofocus mechanism has become widely used.

Patent Literature 1 discloses an image pickup apparatus capable of adjusting its position in an optical axis direction by causing a leg of a lens to abut against a region excluding a light receiving surface of a solid-state image sensing device.

The lens of the image pickup apparatus disclosed by Patent Literature 1 is assembled, during the production process thereof, in a clean room so as to prevent dust and the like from adhering to the light receiving surface of the solid-state image sensing device. Therefore, this apparatus has a problem in which the production cost is high.

For solving this problem, there is an attempt to produce a sensor unit by mounting a solid-state image sensing device on a circuit board, and with the solid-state image sensing device covered with a cover glass, causing a melted resin to flow around the cover glass, and then curing the resin. According to this attempt, since general semiconductors are produced in a clean room, dust and the like can be preventing from adhering to the light receiving surface of the solid-state image sensing devise thus produced. Besides, since the sensor unit (it should be noted that a sensor using a solid-state image sensing device is designated as a sensor unit) is obtained with the cover glass attached thereto, adhesion of dust and the like can be avoided also during transport and assembly.

This attempt also has, however, a problem in which the number of components is increased and the number of production steps is increased. Besides, since a cured resin generally has poor accuracy (because the resultant surface is not flat but irregular in many cases), positioning is difficult in assembling a lens. Furthermore, if a lens is produced by glass molding in consideration of heat resistance, it is difficult, due to restriction in formation accuracy, to accurately form a flange surface against the focal position of the lens.

CITATION LIST

Patent Literature

Patent Literature 1: JP-A-2003-046825

SUMMARY OF INVENTION

Technical Problem

As is well known, injection molding is a method in which a resin molding is obtained by injecting a material having been melt by heating into a mold and cooling/solidifying the resultant. If a lens barrel housing a lens and a holding member holding the lens barrel therein are produced by this method, the following problem arises. Since a resin used for forming the holding member and a resin used for forming the lens barrel generally have different thermal expansion coefficients, when the temperature is lowered after the resin molding performed at a high temperature, a gap is unavoidably formed between the holding member and the lens barrel because of shrinkage after expansion of the resin used for the holding member and the resin used for the lens barrel, and water and the like disadvantageously enters through this gap.

The present invention is devised in consideration of these circumstances, and an object of the present invention is to provide an image pickup apparatus in which the formation of a gap between a holding member and a lens barrel is inhibited so that water can be prevented from entering through the gap.

Solution to Problem

The image pickup apparatus of the present invention includes: a circuit board; a solid-state image sensing device disposed on an upper surface of the circuit board; a cylindrical lens barrel disposed above the circuit board; a lens housed in the lens barrel; and a holding member that holds the lens barrel and the circuit board therein, and the solid-state image sensing device is positioned in an enclosed space formed by the lens barrel and the circuit board, the lens barrel has a first flange portion protruding in a direction perpendicular to a central axis of the lens barrel, the holding member has a first fitting groove portion in which the first flange portion of the lens barrel is fit, and a thermal expansion coefficient of the holding member is smaller than a thermal expansion coefficient of the lens barrel.

When this structure is employed, although both the holding member and the lens barrel shrink through temperature decrease after resin molding of the holding member and the lens barrel performed at a high temperature, since the thermal expansion coefficient of the lens barrel is larger than the thermal expansion coefficient of the holding member, the first flange portion shrinks toward the circuit board where the solid-state image sensing device is disposed, so as to bring the first flange portion and the first fitting groove portion into tight contact with each other without forming a gap. Thus, entry of water can be prevented.

In the above-described structure, the lens barrel further has a second flange portion protruding in the direction perpendicular to the central axis of the lens barrel, and the holding member further has a second fitting groove portion in which the second flange portion of the lens barrel is fit.

When this structure is employed, although both the holding member and the lens barrel shrink through the temperature decrease after the resin molding of the holding member and the lens barrel performed at a high temperature, since the thermal expansion coefficient of the lens barrel is larger than the thermal expansion coefficient of the holding member, also the second flange portion shrinks toward the circuit board on which the solid-state image sensing device is disposed in the same manner as the first flange portion, and the second flange portion and the second fitting groove portion are brought into tight contact with each other without forming a gap. Thus, the entry of water can be prevented.

In the above-described structure, an adhesive material is applied to at least a part of a surface of the first flange portion.

When this structure is employed, owing to the adhesive material applied to the surface of the first flange portion on a side of the circuit board, adhesion between this surface and a surface of the first fitting groove portion in contact with each other is improved, and hence, the entry of water can be more definitely prevented.

In the above-described structure, an adhesive material is applied to at least a part of a surface of the second flange portion.

When this structure is employed, owing to the adhesive material applied to the surface of the second flange portion on the side of the circuit board, the adhesion between this surface and a surface of the second fitting groove portion in contact with each other is improved, and hence, the entry of water can be more definitely prevented.

The image pickup apparatus of the present invention includes: a circuit board; a solid-state image sensing device disposed on an upper surface of the circuit board; a cylindrical lens barrel disposed above the circuit board; a lens housed in the lens barrel; and a holding member that holds the lens barrel and the circuit board therein, and the solid-state image sensing device is positioned in an enclosed space formed by the lens barrel and the circuit board, and a thermal expansion coefficient of the holding member is larger than a thermal expansion coefficient of the lens barrel.

When this structure is employed, although the holding member and the lens barrel shrink through the temperature decrease after the resin molding of the holding member and the lens barrel performed at a high temperature, since the thermal expansion coefficient of the holding member is larger than the thermal expansion coefficient of the lens barrel, the holding member shrinks in a direction for squeezing the lens barrel, and hence, the holding member and the lens barrel are brought into tight contact with each other without forming a gap. Thus, the entry of water can be prevented.

In the above-described structure, the lens barrel has a first flange portion protruding in a direction perpendicular to a central axis of the lens barrel, and the holding member has a first fitting groove portion in which the first flange portion of the lens barrel is fit.

When this structure is employed, the holding member shrinks in the direction for squeezing the lens barrel through the temperature decrease after the resin molding of the holding member and the lens barrel performed at a high temperature, and the first fitting groove portion of the holding member shrinks in a direction toward the axial center of the lens barrel (namely, a direction for squeezing the first flange portion of the lens barrel), and hence, the first flange portion and the first fitting groove portion are brought into tight contact with each other without forming a gap. Thus, the entry of water can be prevented.

In the above-described structure, the image pickup apparatus includes a recess positioned above the lens barrel and formed by the lens barrel and the holding member, and an elastic member is inserted in the recess.

When this structure is employed, the elastic member seals a boundary between the upper end portion of the lens barrel and the upper end portion of the holding member. Thus, entry of water through the recess can be prevented.

Advantageous Effects of Invention

According to the present invention, formation of a gap between a holding member and a lens barrel is inhibited so that water can be prevented from entering through the gap.

DESCRIPTION OF EMBODIMENTS

Preferred embodiments for practicing the present invention will now be described in detail with reference to the accompanying drawings.

Embodiment 1

Figure 1:
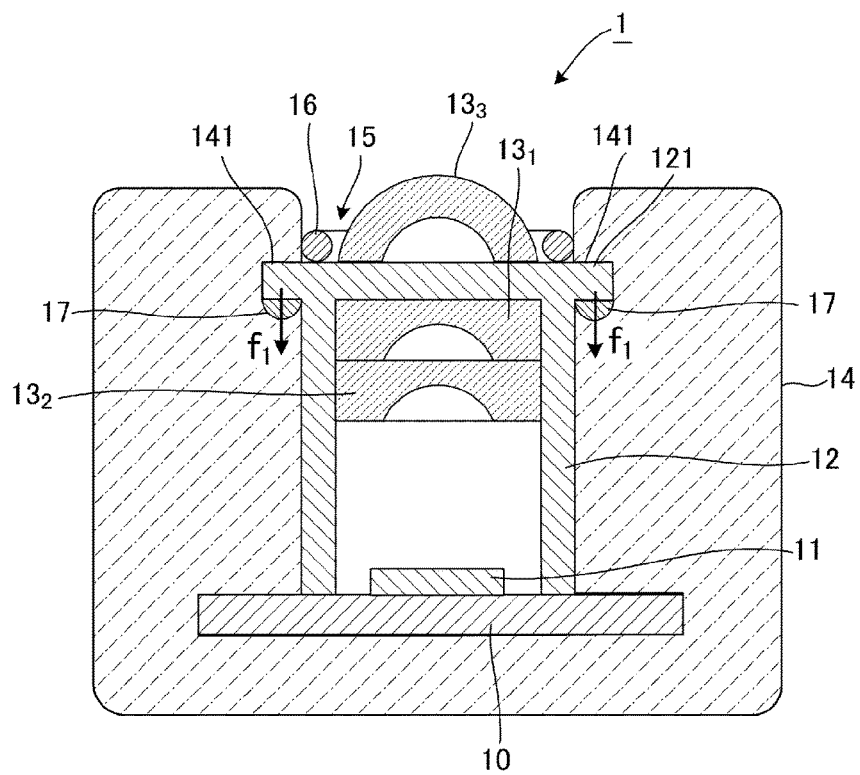
FIG. 1 is a vertical cross-sectional view illustrating the structure of an image pickup apparatus according to Embodiment 1 of the present invention.

FIG. 1 is a vertical cross-sectional view illustrating the structure of an image pickup apparatus according to Embodiment 1 of the present invention. In this drawing, the image pickup apparatus 1 of the present embodiment includes a circuit board 10, a solid-state image sensing device 11 disposed in a center portion on the upper surface of the circuit board 10, a lens barrel 12 that is in a cylindrical shape having the upper end closed by a disc-shaped first flange portion 121, and is disposed on the circuit board 10 with a central axis thereof disposed perpendicular to the circuit board 10, three lenses $13_1$ to $13_3$ housed in the lens barrel 12, a holding member 14 holding the circuit board 10 and the lens barrel 12 therein, and having a first fitting groove portion 141 in which the first flange portion 121 of the lens barrel 12 is fit, and an elastic member 16, such as an O-ring, inserted in a recess 15 formed between the upper surface of the first flange portion 121 of the lens barrel 12 and the upper end portion of the inner wall of the holding member 14.

The first flange portion 121 of the lens barrel 12 is formed in the upper end portion of the lens barrel 12, and protrudes in a direction perpendicular to the central axis of the lens barrel 12. The first flange portion 121 protrudes beyond the lens barrel 12, and has a larger area, in the cross-section perpendicular to the central axis of the lens barrel 12, than a portion excluding it (the first flange portion 121). The first flange portion 121 is formed integrally with the lens barrel 12. In an upper portion on the inner wall of the holding member 14, the first fitting groove portion 141 is formed. The width and the depth of the first fitting groove portion 141 have dimensions determined in accordance with the length of the first flange portion 121 in a direction protruding beyond the lens barrel 12 (corresponding to the depth of the first fitting groove portion 141) and the thickness of the first flange portion 121 (corresponding to the width of the first fitting groove portion 141).

An adhesive material (such as a chemically adhesive primer) 17 is applied to at least one of the lower surface (a surface on a side of the circuit board 10) of the first flange portion 121 of the lens barrel 12 and the lower surface (a surface closer to the circuit board 10) of the first fitting groove portion 141 of the holding member 14. The lens barrel 12 and the holding member 14 are made of resins. In particular, a resin having a smaller thermal expansion coefficient than a resin used for the lens barrel 12 is used for the holding member 14. Here, assuming that the thermal expansion coefficient of the resin used for the holding member 14 is α1 and that the thermal expansion coefficient of the resin used for the lens barrel 12 is α2, these coefficients are in a relationship of $\alpha 2 > \alpha 1$. The three lenses $13_1$ to $13_3$ are housed in the lens barrel 12 so that their central axes respectively accord with the central axis of the lens barrel 12. Among the three lenses $13_1$ to $13_3$, the lenses $13_1$ and $13_2$ are disposed below the first flange portion 121, and the lens $13_3$ is disposed above the first flange portion 121.

As illustrated in FIG. 1, the lens barrel 12 including the first flange portion 121 is held inside the holding member 14, and therefore, the upper surface of the first flange portion 121 is positioned below the upper surface of the holding member 14. Therefore, the recess 15 is formed between the upper surface of the first flange portion 121 and the upper end portion of the inner wall of the holding member 14. The elastic member 16 is inserted in the recess 15. The elastic member 16 is a sealing component, is in a ring shape having a circular cross-section, and has an outer diameter slightly larger than an inside diameter of the holding member 14. A rubber is used as a material of the elastic member 16 in most cases. Such a material is used for preventing a fluid from flowing in or out through a gap between components, and can prevent leakage of various fluids such as oil, water, air and gas. In the present embodiment, it is used for sealing a boundary portion between the upper surface of the first flange portion 121 and the inner wall of the holding member 14.

In the image pickup apparatus 1 having this structure, after performing resin molding of the holding member 14 and the lens barrel 12 at a high temperature, both the holding member 14 and the lens barrel 12 shrink through temperature decrease. At this point, since the thermal expansion coefficient $\alpha 1$ of the resin used for the holding member 14 is smaller than the thermal expansion coefficient $\alpha 2$ of the resin used for the lens barrel 12, the first flange portion 121 of the lens barrel 12 shrinks in a direction $f_1$ (namely, in a direction parallel to the axial center of the lens barrel 12 and toward the circuit board 10). Owing to the shrinkage in the direction $f_1$ of the first flange portion 121, the lower surface of the first flange portion 121 and the lower surface of the first fitting groove portion 141 are brought into tight contact with each other without forming a gap. In this manner, entry of water can be prevented.

Besides, since the adhesive material 17 is applied at least one of the lower surface of the first flange portion 121 and the lower surface of the first fitting groove portion 141, adhesion between the lower surface of the first flange portion 121 and the lower surface of the first fitting groove portion 141 is increased, so as to prevent the entry of water.

Furthermore, since the elastic member 16 is inserted in the recess 15 formed between the first flange portion 121 of the lens barrel 12 and the upper end portion of the holding member 14, the entry of water can be prevented.

In this manner, according to the image pickup apparatus 1 of Embodiment 1, the entry of water can be prevented because it includes the lens barrel 12 having the first flange portion 121 and the holding member 14 having the first fitting groove portion 141 in which the first flange portion 121 of the lens barrel 12 is fit, the resin having a smaller thermal expansion coefficient than the resin used for the lens barrel 12 is used for the holding member 14, and the lower surface of the first flange portion 121 and the lower surface of the first fitting groove portion 141 of the holding member 14 in contact with each other are brought into tight contact with each other without forming a gap in the resin molding of the holding member 14 and the lens barrel 12.

Besides, since the adhesive material 17 is provided between the lower surface of the first flange portion 121 of the lens barrel 12 and the lower surface of the first fitting groove portion 141 of the holding member 14, the entry of water can be more definitely prevented.

Furthermore, since the elastic member 16 is inserted in the recess 15 formed between the first flange portion 121 of the lens barrel 12 and the upper end portion of the holding member 14, the entry of water can be prevented.

Embodiment 2

Figure 2:
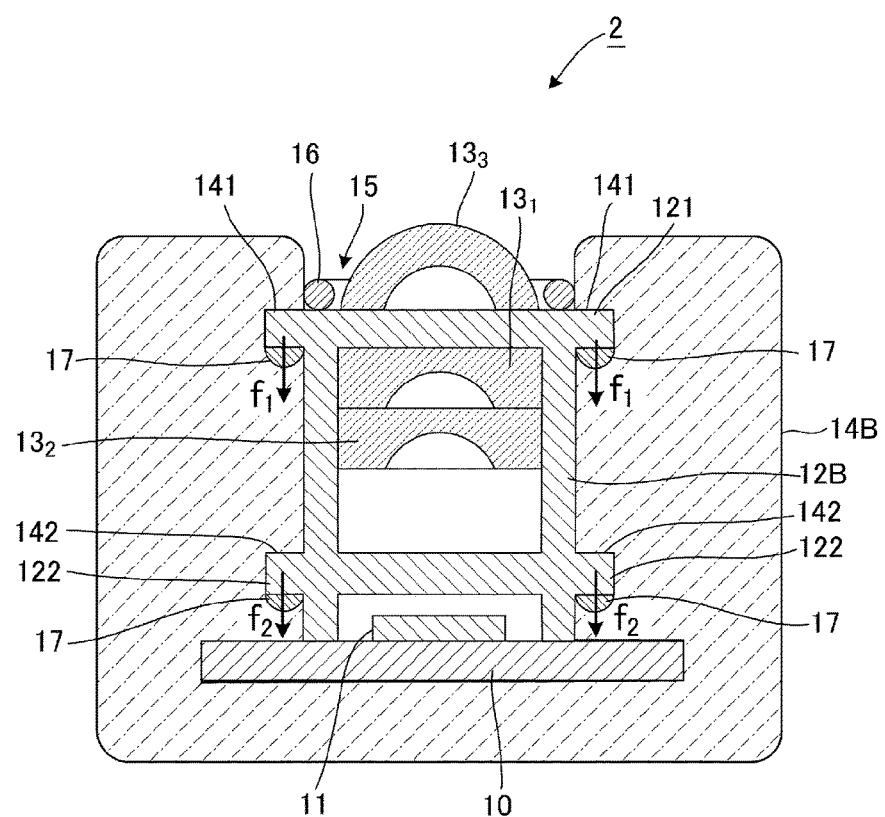
FIG. 2 is a vertical cross-sectional view illustrating the structure of an image pickup apparatus according to Embodiment 2 of the present invention.

FIG. 2 is a vertical cross-sectional view illustrating the structure of an image pickup apparatus according to Embodiment 2 of the present invention. It is noted that like reference signs are used to refer to like elements commonly used in FIG. 1 described above to omit the description.

As illustrated in this drawing, the image pickup apparatus 2 of Embodiment 2 includes a lens barrel 12B having a second flange portion 122 in addition to a first flange portion 121, and a holding member 14B having a second fitting groove portion 142 in which the second flange portion 122 is fit. Besides, an adhesive material 17 is applied to at least one of the lower surface of the second flange portion 122 of the lens barrel 12B and the lower surface of the second fitting groove portion 142 of the holding member 14B. Components excluding the lens barrel 12B and the holding member 14B are the same as those of the image pickup apparatus 1 illustrated in FIG. 1 and described above. Besides, also with respect to resins used for the lens barrel 12B and the holding member 14B, a thermal expansion coefficient $\alpha 1$ of the resin used for the holding member 14B is smaller than a thermal expansion coefficient $\alpha 2$ of the resin used for the lens barrel 12B ($\alpha 2 > \alpha 1$).

In the image pickup apparatus 2 having this structure, after performing the resin molding of the holding member 14B and the lens barrel 12B at a high temperature, both the holding member 14B and the lens barrel 12B shrink through temperature decrease. At this point, since the thermal expansion coefficient $\alpha 1$ of the resin used for the holding member 14B is smaller than the thermal expansion coefficient $\alpha 2$ of the resin used for the lens barrel 12B, both the first flange portion 121 and the second flange portion 122 shrink in the same directions $f_1$ and $f_2$ (namely, in a direction parallel to the axial center of the lens barrel 12B and toward the circuit board 10). Owing to the shrinkage in the direction $f_1$ of the first flange portion 121, the lower surface of the first flange portion 121 and the lower surface of the first fitting groove portion 141 of the holding member 14B in contact with each other are brought into tight contact with each other without forming a gap. Besides, owing to the shrinkage in the direction $f_2$ of the second flange portion 122, the lower surface of the second flange portion 122 and the lower surface of the second fitting groove portion 142 of the holding member 14B in contact with each other are brought into tight contact with each other without forming a gap. In this manner, the entry of water through the gap can be prevented.

Besides, since the adhesive material 17 is applied to at least one of the lower surface of the first flange portion 121 and the lower surface of the first fitting groove portion 141, and the adhesive material 17 is applied to at least one of the lower surface of the second flange portion 122 and the lower surface of the second fitting groove portion 142, adhesion between the lower surface of the first flange portion 121 and the lower surface of the first fitting groove portion 141 and adhesion between the lower surface of the second flange portion 122 and the lower surface of the second fitting groove portion 142 are increased, and thus, no water enters through the gap.

Furthermore, since the elastic member 16 is inserted in a recess 15 formed between the first flange portion 121 of the lens barrel 12B and the upper end portion of the holding member 14B in the same manner as in the image pickup apparatus 1 of Embodiment 1, no water enters through the recess 15.

In this manner, according to the image pickup apparatus 2 of Embodiment 2, the entry of water can be prevented because it includes the lens barrel 12B having the first flange portion 121 and the second flange portion 122, and the holding member 14B having the first fitting groove portion 141 in which the first flange portion 121 of the lens barrel 12B is fit and the second fitting groove portion 142 in which the second flange portion 122 is fit, the resin having a smaller thermal expansion coefficient than the resin used for the lens barrel 12B is used for the holding member 14B, and in the resin molding of the holding member 14B and the lens barrel 12B, the lower surface of the first flange portion 121 and the lower surface of the first fitting groove portion 141 of the holding member 14B in contact with each other are brought into tight contact with each other without forming a gap, and the lower surface of the second flange portion 122 and the lower surface of the second fitting groove portion 142 of the holding member 14B in contact with each other are brought into tight contact with each other without forming a gap.

Besides, since the adhesive material 17 is provided between the lower surface of the first flange portion 121 of the lens barrel 12B and the lower surface of the first fitting groove portion 141 of the holding member 14*b*, and between the lower surface of the second flange portion 122 of the lens barrel 12B and the lower surface of the second fitting groove portion 142 of the holding member 14B, the entry of water can be more definitely prevented.

Furthermore, since the elastic member 16 is inserted in the recess 15 formed between the first flange portion 121 of the lens barrel 12B and the upper end portion of the holding member 14B, the entry of water can be prevented.

Embodiment 3

Figure 3:
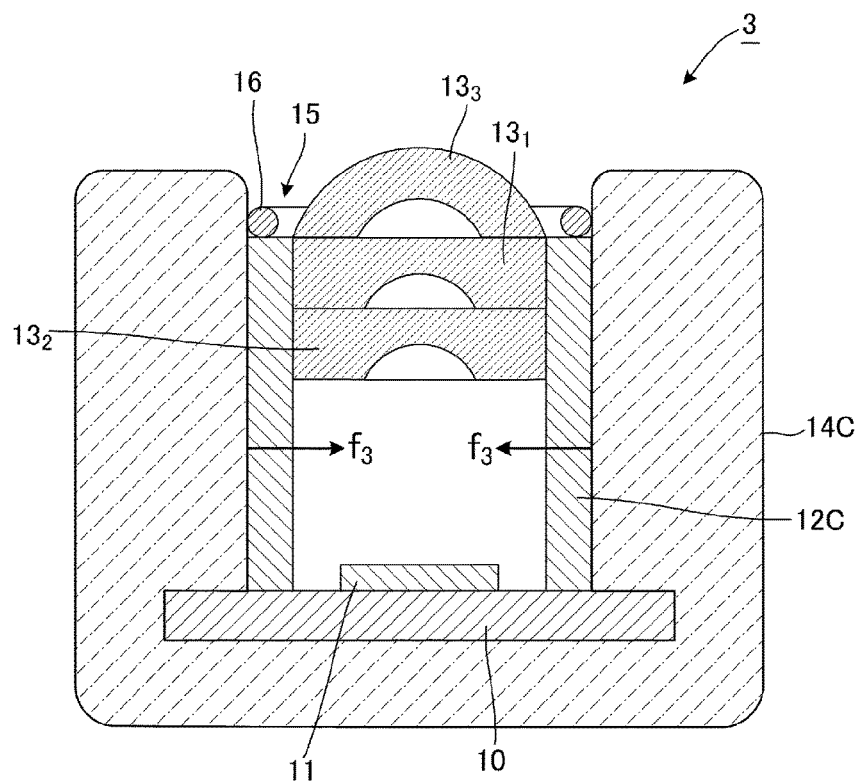
FIG. 3 is a vertical cross-sectional view illustrating the structure of an image pickup apparatus according to Embodiment 3 of the present invention.

FIG. 3 is a vertical cross-sectional view illustrating the structure of an image pickup apparatus according to Embodiment 3 of the present invention. It is noted that like reference signs are used to refer to like elements commonly used in FIG. 1 described above to omit the description.

In this drawing, the image pickup apparatus 3 according to Embodiment 3 includes a circuit board 10, a solid-state image sensing device 11 disposed on the upper surface of the circuit board 10, a cylindrical lens barrel 12C disposed on the circuit board 10, three lenses $13_1$ to $13_3$ housed in the lens barrel 12C, and a holding member 14C holding the lens barrel 12C and the circuit board 10 therein.

In the image pickup apparatus 3 according to Embodiment 3, a resin having a larger thermal expansion coefficient than a resin of the lens barrel 12C is used as a resin of the holding member 14C. Specifically, the thermal expansion coefficient α1 of the resin used for the holding member 14C is larger than the thermal expansion coefficient α2 of the resin used for the lens barrel 12C (α2<α1). The relationship in the thermal expansion coefficient between the resins used for the holding member 14C and the lens barrel 12C is reverse to the relationship in the thermal expansion coefficient between the holding member 14 and the lens barrel 12 (or the holding member 14B and the lens barrel 12B) used in the image pickup apparatus 1 or 2 according to Embodiment 1 or 2 described above.

Besides, in the image pickup apparatus 3 of Embodiment 3, the lens barrel 12C does not have a flange portion, and the holding member 140 does not have a fitting groove portion. An elastic member 16 is, however, inserted in a recess 15 formed between the upper end portion of the lens barrel 12C and the upper end portion of the holding member 14C.

In the image pickup apparatus 3 having this structure, materials are selected so that the thermal expansion coefficient α1 of the holding member 14C can be larger than the thermal expansion coefficient α2 of the lens barrel 120, and in the resin molding of the holding member 140 and the lens barrel 12C, the holding member 14C shrinks in a direction $f_3$ (namely, a direction toward the axial center of the holding member 14C), and hence the holding member 14C and the lens barrel 120 are brought into tight contact with each other without forming a gap. Thus, water does not enter through the gap.

In this manner, according to the image pickup apparatus 3 of Embodiment 3, a resin having a larger thermal expansion coefficient than a resin used for forming the lens barrel 12C is used as the resin for forming the holding member 14C, so that the holding member 140 and the lens barrel 12C can be brought into tight contact with each other without forming a gap in the resin molding of the holding member 140 and the lens barrel 12C, and therefore, the entry of water can be prevented.

Besides, since the elastic member 16 is inserted in the recess 16 formed between the upper end portion of the lens barrel 12C and the upper end portion of the holding member 14C, the entry of water can be prevented.

Embodiment 4

Figure 4:
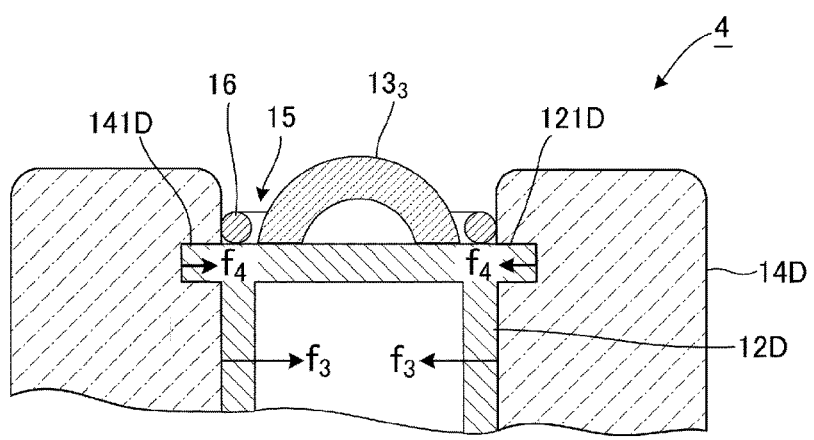
FIG. 4 is a vertical cross-sectional view illustrating the structure of an upper portion of an image pickup apparatus according to Embodiment 4 of the present invention.

FIG. 4 is a vertical cross-sectional view illustrating the structure of an upper portion of an image pickup apparatus according to Embodiment 4 of the present invention. It is noted that like reference signs are used to refer to like elements commonly used in FIGS. 1 and 3 described above to omit the description.

In this drawing, in the image pickup apparatus 4 according to Embodiment 4, a resin having a larger thermal expansion coefficient than a resin used for a lens barrel 12D is used as a resin used for a holding member 14D in the same manner as the materials used for the holding member 14C and the lens barrel 12C of the image pickup apparatus 3 of Embodiment 3 described above. Specifically, the thermal expansion coefficient α1 of the resin used for the holding member 14D is larger than the thermal expansion coefficient α2 of the resin used for the lens barrel 12D (α2<α1).

Differences from the image pickup apparatus 3 of Embodiment 3 described above are that the lens barrel 12D has a first flange portion 121D, and that the holding member 14D has a first fitting groove portion 141D in which the first flange portion 121D of the lens barrel 12D is fit. Incidentally, in the same manner as in the image pickup apparatus 3 of Embodiment 3 described above, an elastic member 16 is inserted in a recess 15 formed between the first flange portion 121D of the lens barrel 12D and the upper end portion of the holding member 14D.

In the image pickup apparatus 4 having this structure, materials are selected so that the thermal expansion coefficient α1 of the holding member 14D can be larger than the thermal expansion coefficient α2 of the lens barrel 12D, and in the resin molding of the holding member 14D and the lens barrel 12D, the holding member 14D shrinks in a direction $f_3$ (namely, a direction toward the axial center of the holding member 14D), and hence the holding member 14D and the lens barrel 12D are brought into tight contact with each other without forming a gap, and in particular, the first fitting groove portion 141D of the holding member 14D shrinks in a direction $f_4$ (namely, in the direction toward the axial center of the holding member 14D), and hence the first flange portion 121D and the first fitting groove portion 141D are also brought into tight contact with each other without forming a gap. In this manner, water does not enter through the gap.

In this manner, the image pickup apparatus 4 according to Embodiment 4 includes the lens barrel 12D having the first flange portion 121D, and the holding member 14D having the first fitting groove portion 141D in which the first flange portion 121D of the lens barrel 12D is fit, and a resin having a larger thermal expansion coefficient than the resin used for the lens barrel 12D is used as the resin used for the holding member 14D, so as to bring the first fitting groove portion 141D and the first flange portion 121D into tight contact with each other without forming a gap, and therefore, the entry of water can be prevented.

Besides, since the elastic member 16 is inserted in the recess 15 formed between the first flange portion 121D of the lens barrel 12D and the upper end portion of the holding member 14D, the entry of water through the recess 15 can be prevented.

The present invention has been described in detail with reference to specific embodiments, and it would be apparent for those skilled in the art that various changes and modifications can be made without departing from the spirit and the scope of the present invention.

This application is based upon the Japanese patent application (Japanese Patent Application No. 2014-238634) filed on Nov. 26, 2014, the entire contents of which are incorporated herein by reference.

INDUSTRIAL APPLICABILITY

The present invention has an effect that no gap is formed between a holding member and a lens barrel even if there is a difference in the thermal expansion coefficient between a resin used for the holding member and a resin used for the lens barrel, and is applicable to, for example, an image pickup apparatus using a solid-state image sensing device such as a CCD image sensor or a CMOS image sensor.

REFERENCE SIGNS LIST 1, 2, 3, 4 image pickup apparatus
10 circuit board
11 solid-state image sensing device
12, 12B, 12C, 12D lens barrel
$13_1$ to $13_3$ lens
14, 14B, 14C, 14D holding member
15 recess
16 elastic member
121, 121D first flange portion
122 second flange portion
141, 141D first fitting groove portion
142 second fitting groove portion

What is claimed is:

1. An image pickup apparatus, comprising:
a circuit board;
a solid-state image sensing device disposed on an upper surface of the circuit board;
a cylindrical lens barrel disposed above the circuit board;
a lens housed in the lens barrel; and
a holding member that holds the lens barrel and the circuit board therein,
wherein the solid-state image sensing device is positioned in an enclosed space formed by the lens barrel and the circuit board;
wherein the lens barrel has a first flange portion protruding in a direction perpendicular to a central axis of the lens barrel;
wherein the holding member has a first fitting groove portion in which the first flange portion of the lens barrel is fit; and
wherein a thermal expansion coefficient of the holding member is smaller than a thermal expansion coefficient of the lens barrel.

2. The image pickup apparatus according to claim 1, wherein the lens barrel further has a second flange portion protruding in the direction perpendicular to the central axis of the lens barrel; and
wherein the holding member further has a second fitting groove portion in which the second flange portion of the lens barrel is fit.

3. The image pickup apparatus according to claim 2, wherein an adhesive material is applied to at least a part of a surface of the second flange portion.

4. The image pickup apparatus according to claim 1, wherein an adhesive material is applied to at least a part of a surface of the first flange portion.

5. The image pickup apparatus according to claim 1, comprising a recess positioned above the lens barrel and formed by the lens barrel and the holding member,
wherein an elastic member is inserted in the recess.

6. An image pickup apparatus, comprising:
a circuit board;
a solid-state image sensing device disposed on an upper surface of the circuit board;
a cylindrical lens barrel disposed above the circuit board;
a lens housed in the lens barrel; and
a holding member that holds the lens barrel and the circuit board therein,
wherein the solid-state image sensing device is positioned in an enclosed space formed by the lens barrel and the circuit board; and
wherein a thermal expansion coefficient of the holding member is larger than a thermal expansion coefficient of the lens barrel.

7. The image pickup apparatus according to claim 6, wherein the lens barrel has a first flange portion protruding in a direction perpendicular to a central axis of the lens barrel; and
wherein the holding member has a first fitting groove portion in which the first flange portion of the lens barrel is fit.

8. The image pickup apparatus according to claim 6, comprising a recess positioned above the lens barrel and formed by the lens barrel and the holding member, wherein an elastic member is inserted in the recess.

* * * * *